US009588199B2

(12) United States Patent
Kess

(10) Patent No.: US 9,588,199 B2
(45) Date of Patent: Mar. 7, 2017

(54) DETECTING UNPLUGGED LOCAL COILS IN A NUCLEAR MAGNETIC RESONANCE TOMOGRAPH

(71) Applicant: Helmut Kess, Erlangen (DE)

(72) Inventor: Helmut Kess, Erlangen (DE)

(73) Assignee: Siemens Aktiengesellschaft, München (DE)

(*) Notice: Subject to any disclaimer, the term of this patent is extended or adjusted under 35 U.S.C. 154(b) by 1004 days.

(21) Appl. No.: 13/858,425

(22) Filed: Apr. 8, 2013

(65) Prior Publication Data
US 2013/0271129 A1  Oct. 17, 2013

(30) Foreign Application Priority Data
Apr. 13, 2012  (DE) .................. 10 2012 206 066

(51) Int. Cl.
*G01R 33/36* (2006.01)
*G01R 33/28* (2006.01)

(52) U.S. Cl.
CPC .......... *G01R 33/36* (2013.01); *G01R 33/288* (2013.01); *G01R 33/3692* (2013.01)

(58) Field of Classification Search
USPC ............... 324/300–322; 340/572.7; 375/327; 600/407–435; 382/128–131
See application file for complete search history.

(56) References Cited

U.S. PATENT DOCUMENTS

| 5,551,430 | A | 9/1996 | Blakeley et al. |
| 6,362,622 | B1 | 3/2002 | Stauber et al. |
| 6,943,551 | B2 | 9/2005 | Eberler et al. |
| 7,180,294 | B2 | 2/2007 | Kohlmuller |
| 7,230,425 | B2 | 6/2007 | Leussler |
| 7,696,754 | B2 | 4/2010 | Kess |
| 7,821,402 | B2* | 10/2010 | Yang .................. A61N 1/08 340/572.5 |
| 9,226,686 | B2* | 1/2016 | Blair .................. A61B 5/062 |
| 2006/0232275 | A1 | 10/2006 | Leussler |
| 2007/0008112 | A1 | 1/2007 | Covannon et al. |

(Continued)

FOREIGN PATENT DOCUMENTS

CN  1221493 A   6/1999
CN  101067848 A  11/2007
(Continued)

OTHER PUBLICATIONS

German Office Action dated Dec. 10, 2012 for corresponding German Patent Application No. DE 10 2012 206 066.9 with English translation.
(Continued)

*Primary Examiner* — Melissa Koval
*Assistant Examiner* — Tiffany Fetzner
(74) *Attorney, Agent, or Firm* — Lempia Summerfield Katz LLC

(57) ABSTRACT

The present embodiments relate to apparatuses and methods for detecting unplugged local coils in a magnetic resonance tomography (MRT) device. The MRT device includes a local coil that has a RFID tag configured to detect transmitted RFID signals. When at least one transmitted RFID signal is detected, at least one unplugged local coil is detected in the MRT device.

30 Claims, 3 Drawing Sheets

(56) References Cited

U.S. PATENT DOCUMENTS

| | | | |
|---|---|---|---|
| 2007/0257800 A1* | 11/2007 | Yang ........................ | A61N 1/08 340/572.7 |
| 2009/0105583 A1 | 4/2009 | Martin et al. | |
| 2011/0181394 A1* | 7/2011 | Blair ........................ | A61B 5/062 340/10.1 |
| 2012/0139538 A1 | 6/2012 | Schmidt et al. | |
| 2013/0271129 A1* | 10/2013 | Kess ........................ | G01R 33/36 324/307 |
| 2016/0157957 A1* | 6/2016 | Blair ........................ | A61B 5/062 235/492 |

FOREIGN PATENT DOCUMENTS

| | | |
|---|---|---|
| CN | 101277671 A | 10/2008 |
| CN | 101390754 A | 3/2009 |
| CN | 102331566 A | 1/2012 |
| DE | 10314215 B4 | 11/2006 |
| DE | 102007026915 | 1/2009 |
| JP | 2007502138 A | 2/2007 |
| WO | WO2007116862 A1 | 10/2007 |

OTHER PUBLICATIONS

Korean Office action for related Korean Application No. 10-2013-0040477, dated Jun. 22, 2015, with English Translation.
Chinese Office Action for Chinese Patent Application No. 201310122238.7, mailed Oct. 29, 2015, with English Translation.

* cited by examiner

DETECTING UNPLUGGED LOCAL COILS IN A NUCLEAR MAGNETIC RESONANCE TOMOGRAPH

This application claims the priority benefit of German Patent Application DE 10 2012 206 066.9, filed Apr. 13, 2012, which is hereby incorporated herein in its entirety.

BACKGROUND

The present embodiments relate to apparatuses and methods for detecting unplugged local coils in a nuclear magnetic resonance tomograph (MRT).

Magnetic resonance tomographs (MRTs) for examining objects or patients using magnetic resonance tomography are known, for example, from DE10314215B4.

BRIEF SUMMARY

The present embodiments may obviate one or more of the drawbacks or limitations in the related art. For example, the detection of unplugged local coils in a nuclear MRT may be optimized.

DETAILED DESCRIPTION OF THE FIGURES

Figure 3:
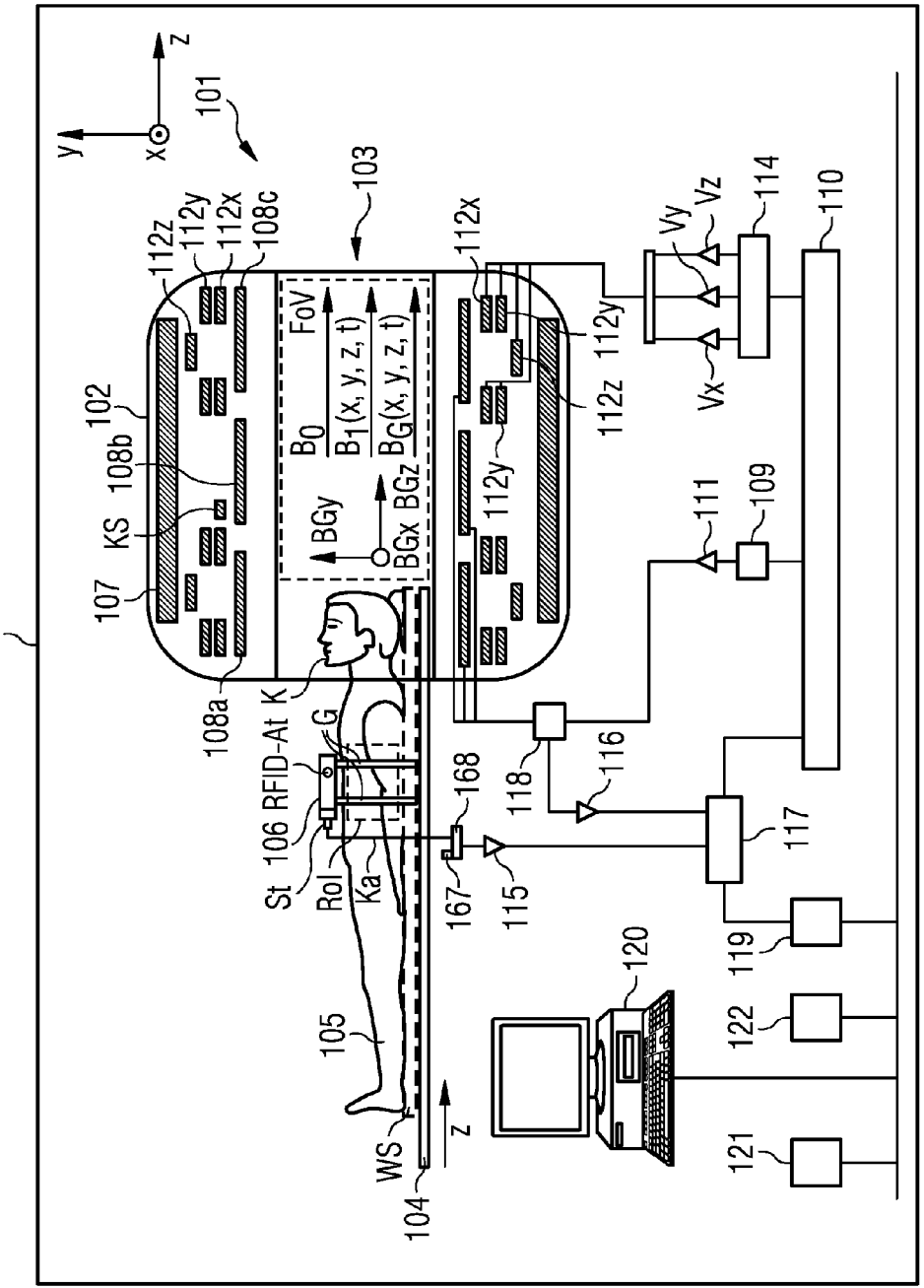
FIG. 3 shows one embodiment of an MRT system.

FIG. 3 shows a magnetic resonance tomography device (MRT) 101 (e.g., located in a screened room or Faraday cage F) having a whole body coil 102. The whole body coil 102 has a tubular chamber 103 into which a patient couch 104 with a body of, for example, an object to be examined (e.g., a patient) 105, with or without a local coil arrangement 106, may be moved in the direction of the arrow z to generate images of the patient 105 using an imaging method. Arranged on the patient is a local coil arrangement 106, which may be used to generate images of a partial region of the body 105 in a local region (also referred to as the field of view or FOV) of the MRT. Signals from the local coil arrangement 106 may be evaluated (e.g., converted into images, stored, or displayed) by an evaluation device (e.g., the evaluation device 168, 115, 117, 119, 120, or 121) of the MRT 101. The evaluation device may be connected to the local coil arrangement 106 by, for example, coaxial cables or a wireless connection 167.

In order to examine a body 105 (e.g., an object for examination or a patient) with magnetic resonance imaging using the MRT device 101, different magnetic fields, which are tuned to one another as precisely as possible with respect to their temporal and spatial characteristics, are radiated onto the body 105. A powerful magnet (e.g., a cryomagnet 107) arranged in a measuring cabin (e.g., having a tunnel-shaped opening 103) generates a powerful static main magnetic field $B_0$, (e.g., measuring 0.2 tesla to 3 Tesla or more than 3 Tesla). The body 105 to be examined is placed on a patient couch 104 and moved into an approximately homogeneous region of the main magnetic field $B_0$ in the field of view FoV. The nuclear spins of atomic nuclei of the body 105 are excited by magnetic radio-frequency excitation pulses B1(x, y, z, t) radiated into the nuclei via a radio-frequency antenna, which is shown here in simplified form as a body coil 108 (e.g., with parts 108a, 108b, 108c), and/or a local coil arrangement. High-frequency excitation pulses are generated by, for example, a pulse generation unit 109 that is controlled by a pulse-sequence control unit 110. After the high-frequency pulses are amplified by a radio-frequency amplifier 111, the pulses are guided to the radio-frequency antenna 108. The radio-frequency system shown in FIG. 3 is exemplary. In other embodiments, more than one pulse generation unit 109, more than one radio-frequency amplifier 111, and a plurality of radio-frequency antennas 108a, 108b, 108c may be used in the MRT device 101.

The MRT device 101 further includes gradient coils 112x, 112y, 112z, with which magnetic gradient fields $B_G(x, y, z, t)$ are radiated during a measurement for selective slice excitation and for spatial encoding of the measuring signal. The gradient coils 112x, 112y, 112z are controlled by a gradient coil control unit 114, which, like the pulse generation unit 109, is connected to the pulse-sequence control unit 110.

The signals emitted by the excited nuclear spins of the atomic nuclei in the object to be examined are received by the body coil 108 and/or at least one local coil arrangement 106, amplified by assigned radio-frequency preamplifiers 116 and further processed and digitized by a receiver unit 117. The recorded measured data is digitized and stored as complex numerical values in a k-space matrix. An associated MR image may be reconstructed from the k-space matrix containing the complex numerical values by, for example, a multidimensional Fourier transformation.

For a coil that may be operated in both the transmit mode and the receive mode, such as, for example, the body coil 108 or an MRT local coil 106, correct signal forwarding is regulated by an upstream transceiver switch 118.

An image processing unit 119 generates an image from the measured data. The image is displayed to a user via an operator console 120 and/or stored in a memory unit 121. A central computer unit 122 controls the individual components of the system.

In MRT, images with a signal-to-noise ratio (SNR) are usually recorded with local coil arrangements (coils or local coils). Local coil arrangements are antenna systems that are attached in the immediate vicinity above (e.g., anteriorly), below (e.g., posteriorly), on, or in the body 105. During an MR measurement, the excited nuclei induce a voltage in the individual antennas of the local coil, which is then amplified with a low-noise preamplifier (e.g., LNA, preamp) and then forwarded to the receive electronics. High-field systems (e.g., 1.5-12 Tesla or more) are used to improve the signal-to-noise ratio, even for high-resolution images. If a number of individual antennas that may be connected to an MR receiving system exceeds a number of available receivers, a switch matrix (also known as RCCS), for example, is installed between the receiving antennas and the receivers. The switch matrix routes the currently active receiving channels (generally those located in the field of view of the magnet) to the available receivers. As such, more coil elements may be connected than there are receivers available, since, with respect to whole body coverage, only the local coils 106 located in the FoV (field of view) or in the homogeneity volume of the magnet have to be read out.

The local coil arrangement 106 is, for example, an antenna system that may, for example, include one or more antenna elements (e.g., coil elements). The antenna elements may be, for example, loop antennas (loops), butterfly antennas, flex coils, or saddle coils. A local coil arrangement includes, for example, coil elements, a preamplifier, other electronics (e.g., sheath wave traps, etc.), a housing, supports, and a cable with a plug that connects the local coil arrangement to the MRT system. A receiver 168 mounted on the system filters and digitizes a signal received (e.g., wirelessly) from a local coil 106 and transfers the data to a digital signal processor. From the data obtained from the measurement, the digital signal processor derives an image or a spectrum and makes the image or spectrum available to the user for, for example, diagnostic reasons (e.g., subsequent diagnosis) by the user and/or for storing.

Figure 1:
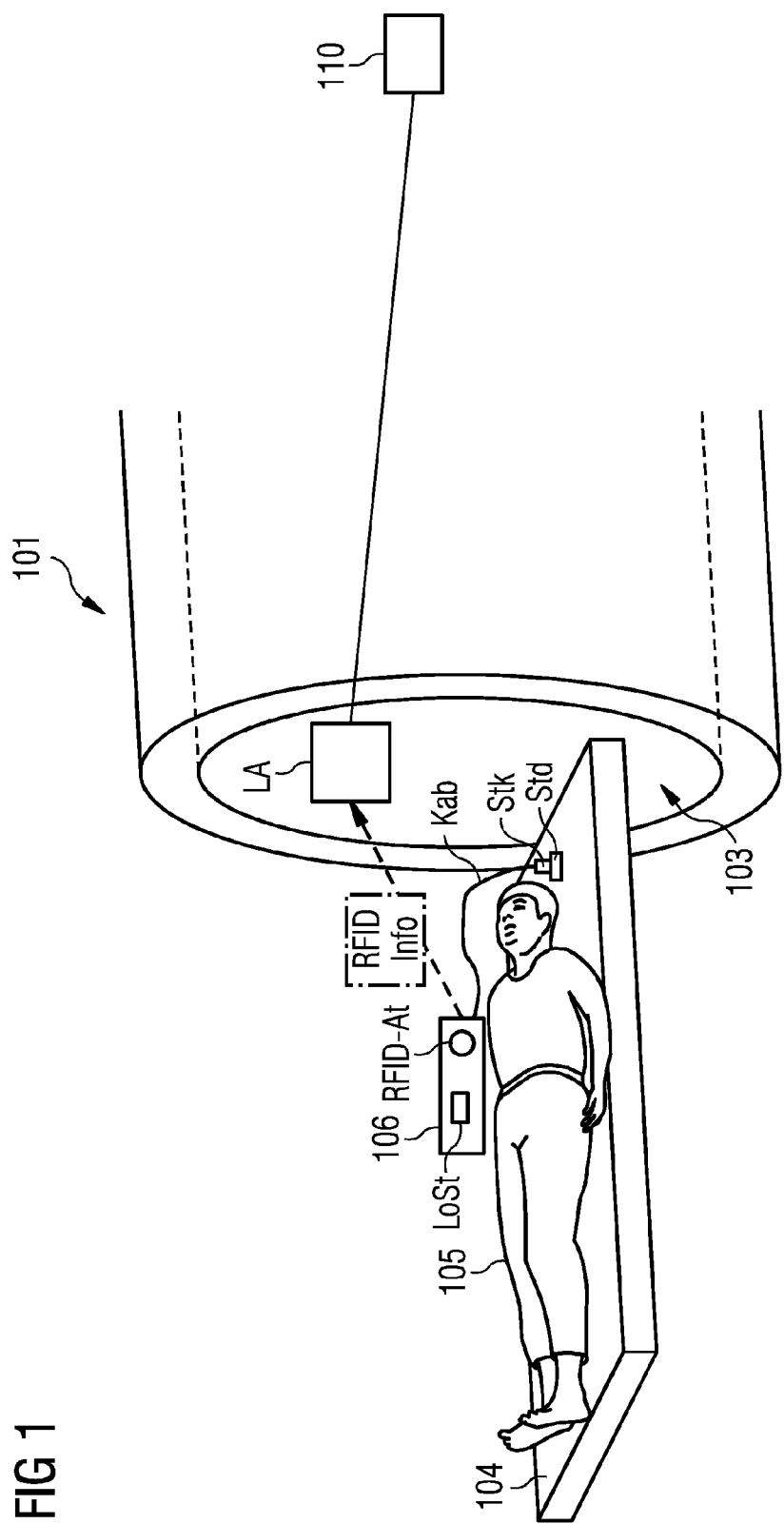
FIG. 1 shows one embodiment of an MRT and a patient on a patient couch with a local coil with a radio-frequency identification (RFID) tag.
Figure 2:
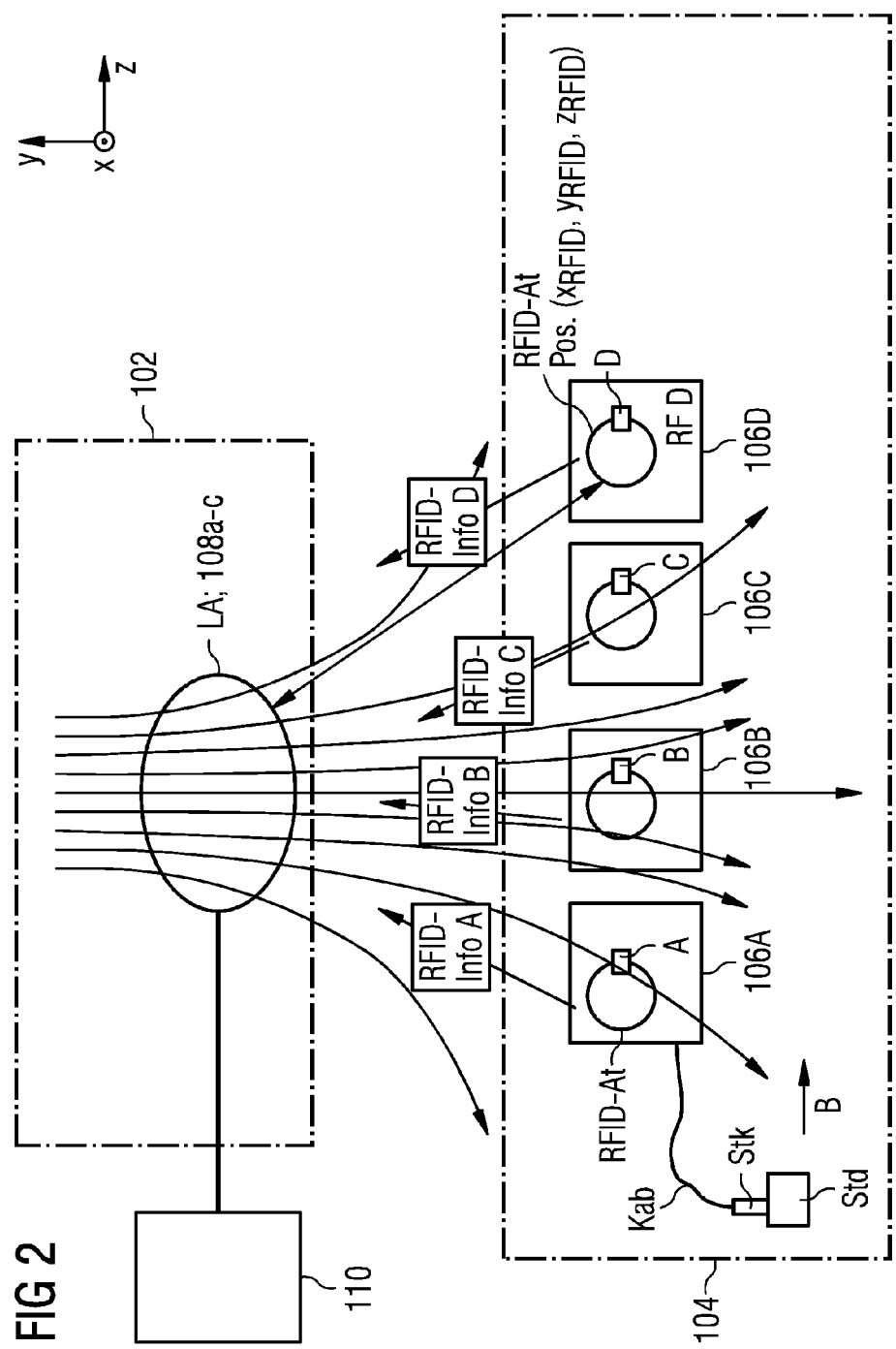
FIG. 2 shows one embodiment of an MRT controller, a RFID reader, and local coils on a patient couch each having a RFID tag.

FIGS. 1 and 2 show various embodiments of apparatuses and methods for local coil detection.

FIG. 1 shows a MRT device 101 with a RFID reader LA (or 108a, 108b, or 108c) spatially located, for example, in the region (e.g., the entrance) of the bore 103, and a patient 105 on a patient couch 104 and shows a (MRT) local coil 106 in which a RFID tag RFID-At, with an RFID antenna, transmits a RFID signal RFID-Info to a reader LA (or; 108a, 108b, or 108c). The reader LA may, for example, inform a controller 110 of the MRT of received RFID signals RFID-Info so that the controller 110 detects which (unplugged) RFID tags A, B, C, D, and which RFIDs, and, hence, how many and/or which local coils 106 are located in the region of (e.g., close to, at a distance of less than 0.5 m, 1 m, 2 m, 5 m, or 10 m, within a detectable distance, in, or combinations thereof) the bore 103 of the MRT device 101.

FIG. 2 is a simplified view of a RFID reader LA connected to a controller 110 of an MRT and a plurality of local coils 106A, 106B, 106C, 106D on a patient couch 104. Each of the plurality of local coils 106A, 106B, 106C, 106D includes a RFID tag (also referred to as a RFID chip, a tag, or a RFID transmitter) RFID-At. Each RFID tag may transmit at least one RFID signal RFID-Info-A, RFID-Info-B, RFID-Info-C, or Info-D to the reader LA. In FIG. 2, RFID-Info-A is not transmitted. As shown in FIG. 2, the reader LA may, for example, inform a controller 110 of the MRT about received RFID signals RFID-Info-B, RFID-Info-C, and RFID-Info-D so that the controller 110 knows which RFID tags RFID-At (with transmitters A, B, C, D), and, hence, how many (in this case, three) and/or which unplugged local coils 106B, 106C, 106D, are located in the region of the bore 103 of the MRT 101. RFID transmission methods and apparatuses are, for example, known from http://de.wikipedia.org/wiki/RFID, and the cross references contained therein.

When a local coil 106 is introduced in the bore 103 of a nuclear MRT 101, and not, as in the case of the local coil 106A shown in FIG. 2, plugged, via a connection cable, a plug Stk and, for example, a connection socket (e.g., in a patient couch 104), into a power supply of the local coil 106 through the MRT, the patient 105 may be endangered or the local coil 106 may be damaged.

Conventionally, local coils 106 may, for example, be detuned via a passive circuit (diodes) to ensure that local coils 106B, 106C, 106D that are not plugged into the MRT device (i.e., local coils not also plugged into their power supply) do not cause any interference. The local coils 106 are thereby also protected. In the event that this passive protection fails, fuses may, for example, be installed that blow if the HF currents in this local coil 106 are too high and, hence, serve to also protect the patient.

According to various embodiments described herein, such as, for example, those depicted in FIGS. 1 and/or 2, an unplugged (Stk, Std) local coil 106B, 106C, 106D may be detected by RFID.

To this end, a RFID tag (e.g., a passive transmitter) is installed in local coils 106, such as local coils 106A, 106B, 106C, 106D. The RFID tag issues an alert when it is supplied with energy from a transmitter (e.g., LA or 108a-c). The transmitter LA/108a-c may, in some embodiments, also be a receiver that detects and evaluates a RFID tag signal (e.g., RFID tag signals RFID-Info-A, RFID-Info-B, RFID-Info-C, RFID-Info-D) and, for example, reports the RFID tag signal with a controller 110 of the MRT device and/or causes the RFID tag signal to be indicated optically and/or by an acoustic warning signal.

A RFID device LA (which also transmits RF signals and receives responses from tags, at, for example, 13.56 MHz) may, however, incur certain costs. The limits of operational functional capability may be reached as a result of interactions with the body resonator and patient.

If, for example, a working frequency of the nuclear MRT (e.g., a frequency used for transmission by the radio-frequency coils of the MRT device) is used as the RFID transmit frequency of the RFID tags, instead of the usual frequency of, for example, 13.56 MHz, an additional device LA working on, for example, 13.56 MHz, may be dispensed with. In this way, instead of LA (that is, without an additional device LA on the MRT), the transmit/receive antenna (body resonator such as, for example, 108a, 108b, 108c) is used as a RFID transmitter and/or as a RF-response-receiving device 108a, b, c, respectively, and/or, used for the evaluation with existing evaluation mechanisms (108a-c, 118, 117, 119, 120, 110 etc) of the MRT, for signals also emitted by the object to be examined 105 after MRT (HF) excitation.

Therefore, in addition to the MRT device, according to one embodiment, the only components used, apart from adapted software (e.g., the controller 110 and/or 117) are, for example, RFID tags A, B, C, D on/in local coils 106A-D that operate on a working frequency of the nuclear MRT 101.

The TAG signals may be evaluated via, for example, an evaluation chain (e.g., chain 110, etc.) of the nuclear MRT 101 also present for MRT imaging. In one embodiment, for example, the item number, serial number, etc., of an unplugged local coil 106B may be detected, particularly if a controller 110, 120 of the MRT device may assign this to an RFID tag and/or signals (e.g., signals RFID-Info-A, RFID-Info-B, RFID-Info-C, RFID-Info-D) received by a RFID tag A, B, C, D because the information is known to the controller 110, 120.

As an example, an unplugged local coil 106A, 106B, 106C, 106D may be detected as follows: when a patient 105, on a patient couch 104, has been positioned in the bore 103 of an MRT 101, the body resonator of the MRT device transmits at or using the working frequency (e.g., high-frequency excitation pulses). If a local coil 106A is plugged-in (using, for example, Stk, Std), the RFID tag A is deactivated (so that it, for example, no longer transmits), via, for example, the existing power supply in the local coil 106A. If no further local coils are present, the system detects no unplugged local coil (because, for example, no unplugged local coils exist) and then permits the MRT imaging measuring sequence.

If, on the other hand, a local coil (e.g., local coil 106B, 106C, 106D in FIG. 2) is not plugged-in (i.e., there is no blockade on transmission, as a blockade may be activated when there is a power supply to the local coil), the local coil's respective RFID tag B, C, D transmits information RFID-Info. The RFID tag A, B, C, D, each having an antenna RFID-At, stores the energy from the excitation signal the tag has received (e.g., in the form of high-frequency excitation pulses) of the body resonator of the MRT device, and responds to the body resonator, for example after the resonator's excitation signal has finished. The body resonator receives this signal and the evaluation chain detects a RFID-transmitting and, hence, unplugged local coil 106B, 106C, 106D. In turn, the subsequent MRT device imaging measuring sequence may be prevented or aborted.

The methods described herein may also be useful with local transceiver coils. The local transceiver coils may be internally equipped with fuses in order prevent coupling with the transmitting body resonator if this local transceiver coil (e.g., coil 106B, 106C, 106D in FIG. 2) has not been plugged-in.

Likewise, the methods described herein may be applied to local transceiver coils (e.g., X-core coils) with a frequency different from the normal working frequency.

The regulations applicable to RFID with respect to frequency, power, etc., are not problematic in screened rooms with nuclear MRTs 101, since the work is performed at the working frequency of these MRTs.

By detecting an unplugged local coil 106 in the magnetic field of an MRT in this way, it may be possible to dispense with passive detuning and fuses. Alternatively, passive detuning and fuses may be supplementally used. A controller 110 of the MRT may also, for example, identify the local coils 106A, 106B, 106C, 106D connected to a socket Std of the MRT device via cables Kab and/or plugs Stk from or using signals, a power consumption, a voltage drop, or combinations thereof, at a socket Std of a patient couch. A controller 110 of the MRT device may, therefore, for example, compare local coils 106A known to the controller as being plugged-in at a socket Std of a patient couch (in FIG. 2 only) and local coils 106A, 106B, 106C, 106D detected by RFID signals RFID-Info-A, RFID-Info-B, RFID-Info-C, and RFID-Info-D to determine (by, for example, the strength of RFID signals) which local coils 106B, 106C, 106D are in the RFID detection region and not plugged-in (to, for example, the plug Stk and/or socket Std).

While the present invention has been described above by reference to various embodiments, it should be understood that many changes and modifications may be made to the described embodiments. It is therefore intended that the foregoing description be regarded as illustrative rather than limiting, and that it be understood that all equivalents and/or combinations of embodiments are intended to be included in this description.

The invention claimed is:

1. A local coil configured for a magnetic resonance tomography (MRT) device, the local coil comprising:
   a radio-frequency identification (RFID) tag supported by the local coil,
   wherein the local coil with the RFID tag is configured to:
      enable the RFID tag to transmit RFID information when the local coil is unplugged from the MRT device, such that presence of the unplugged local coil is detectable before an MRT imaging sequence is performed; and
      prevent the RFID tag from transmitting RFID information when the local coil is plugged into the MRT device.

2. The local coil as claimed in claim 1, wherein at least one RFID tag transmit frequency used for transmitting an RFID signal from the RFID tag is a transmit frequency of the MRT device.

3. The local coil as claimed in claim 1, wherein at least one RFID tag transmit frequency used for transmitting an RFID signal from the RFID tag is a transmit frequency equal to 42.6 MHz per Tesla of field strength of the MRT device.

4. The local coil as claimed in claim 1, wherein at least one RFID tag transmit frequency used for transmitting an RFID signal from the RFID tag is equal to 42.6 MHz, 62-63 MHz, 85.2 MHz, 127.8 MHz, or 298.2 MHz.

5. A magnetic resonance tomography (MRT) device comprising:
   a controller configured to detect radio-frequency identification (RFID) tags supported by a plurality of local coils that transmit RFID signals based on respective RFID signals received by the MRT device,
   wherein a first local coil of the plurality of local coils is configured to enable a first of the RFID tags to transmit RFID information when the first local coil is unplugged from the MRT device, and to prevent the first RFID tag from transmitting RFID information when the first local coil is plugged into the MRT device, such that presence of the unplugged local coil is detectable before an MRT imaging sequence is performed.

6. The MRT device as claimed in claim 5, wherein the controller is configured to display the detected transmitting RFID tags, local coils corresponding to the detected transmitting RFID tags, or a combination thereof.

7. The MRT device as claimed in claim 6, wherein the controller is configured to display one or more local coils that are unplugged.

8. The MRT device as claimed in claim 5, wherein the controller is configured to stop MRT examinations.

9. The MRT device as claimed in claim 5, wherein the controller is configured to receive a RFID signal having an RFID transmit frequency equal to a transmit frequency of the magnetic resonance tomography device.

10. The MRT device as claimed in claim 5, wherein the controller is configured to receive a RFID signal having an RFID tag transmit frequency of 42.6 MHz per Tesla of field strength of the MRT device.

11. The MRT device as claimed in claim 5, wherein the controller is configured to receive a RFID signal having an RFID tag transmit frequency of 42.6 MHz, 62-63 MHz, 85.2 MHz, 127.8 MHz, or 298.2 MHZ.

12. The MRT device as claimed in claim 5, further comprising a receiving mechanism configured to receive a RFID signal having an RFID transmit frequency equal to a transmit frequency of the magnetic resonance tomography device.

13. The MRT device as claimed in claim 5, further comprising a receiving mechanism configured to receive a RFID signal having an RFID tag transmit frequency of 42.6 MHz per Tesla of field strength of the MRT device.

14. The MRT device as claimed in claim 5, further comprising a receiving mechanism configured to receive a RFID signal having an RFID tag transmit frequency of 42.6 MHz, 62-63 MHz, 85.2 MHz, 127.8 MHz, or 298.2 MHZ.

15. The MRT device as claimed in claim 5, wherein the controller is configured to receive an RFID signal having an RFID transmit frequency and to transmit signals from the MRT device for MRT imaging.

16. The MRT device as claimed in claim 5, further comprising a receiving mechanism configured to receive an RFID signal having an RFID transmit frequency and to transmit signals from the MRT device for MRT imaging.

17. A method that detects at least one unplugged local coil with a magnetic resonance tomography (MRT) device, the method comprising:
   detecting, by the MRT device, one or more RFID signals transmitted by a local coil with an RFID tag;

enabling, by the local coil, the RFID tag of the local coil in order to transmit RFID information when the local coil is unplugged from the MRT device, such that presence of the unplugged local coil is detectable before an MRT imaging sequence is performed; and preventing, by the local coil, the RFID tag of the local coil from transmitting RFID information when the local coil is plugged into the MRT device.

18. The method as claimed in claim 17, further comprising determining that the local coil is unplugged when at least one RFID signal of the one or more RFID signals is detected.

19. The method as claimed in claim 17, wherein detecting comprises detecting one or more RFID signals having a transmit frequency equal to a transmit frequency of the MRT device.

20. The method as claimed in claim 17, wherein detecting comprises detecting one or more RFID signals having a transmit frequency of 42.6 MHz per Tesla of field strength of the MRT device.

21. The method as claimed in claim 17, wherein detecting comprises detecting one or more RFID signals having a transmit frequency of 42.6 MHz, 62-63 MHz, 85.2 MHz, or 298.2 MHz.

22. The method as claimed in claim 17, further comprising:
detecting, by the local coil, whether the local coil is plugged in to the MRT device.

23. The method as claimed in claim 17, further comprising:
receiving RFID signals by the MRT device; and
detecting, by a controller of the MRT device, RFID tags transmitting RFID signals based on the received RFID signals.

24. The method as claimed in claim 17, further comprising displaying one or more transmitting RFID tags identified from the one or more RFID signals, identified due to the presence of one or more local coils, or a combination thereof.

25. The method as claimed in claim 17, further comprising displaying one or more transmitting RFID tags identified based on the at least one unplugged local coil.

26. The method as claimed in claim 17, further comprising stopping MRT examinations conducted using the MRT device when at least one local coil is unplugged.

27. The method as claimed in claim 26, wherein stopping the MRT examinations comprises stopping the MRT device from transmitting signals.

28. The method as claimed in claim 17, further comprising receiving, via a receiving mechanism and/or controller of the MRT device, the one or more RFID signals, the one or more RFID signals having a RFID transmit frequency corresponding to a transmit frequency of the MRT device.

29. The method as claimed in claim 28, wherein receiving the one or more RFID signals comprises receiving the one or more RFID signals having a RFID tag transmit frequency of 42.6 MHz per Tesla of field strength of the MRT device.

30. The method as claimed in claim 28, wherein receiving the one or more RFID signals comprises receiving the one or more RFID signals having a RFID tag transmit frequency of 42.6 MHz, 62-63 MHz, 85.2 MHz, 127.8 MHz, 298.2 MHz, or combinations thereof.

* * * * *